US012278297B2

(12) United States Patent
Bian

(10) Patent No.: US 12,278,297 B2
(45) Date of Patent: Apr. 15, 2025

(54) PHOTONIC STRUCTURE WITH WAVEGUIDE-TO-PHOTODETECTOR COUPLER ORIENTED ALONG SIDEWALL OF A PHOTODETECTOR

(71) Applicant: GlobalFoundries U.S. Inc., Malta, NY (US)

(72) Inventor: Yusheng Bian, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 267 days.

(21) Appl. No.: 18/050,147

(22) Filed: Oct. 27, 2022

(65) Prior Publication Data

US 2024/0142725 A1 May 2, 2024

(51) Int. Cl.
| | |
|---|---|
| H01L 31/0232 | (2014.01) |
| G02B 6/12 | (2006.01) |
| H01L 31/105 | (2006.01) |
| G02B 6/42 | (2006.01) |

(52) U.S. Cl.
CPC ...... *H01L 31/02327* (2013.01); *H01L 31/105* (2013.01); *G02B 6/12004* (2013.01); *G02B 6/4203* (2013.01)

(58) Field of Classification Search
CPC .................. H01L 31/02327; H01L 31/105
See application file for complete search history.

(56) References Cited

U.S. PATENT DOCUMENTS

| | | | | |
|---|---|---|---|---|
| 7,397,101 | B1 * | 7/2008 | Masini | G02B 6/4295 |
| | | | | 257/656 |
| 9,391,225 | B1 * | 7/2016 | Davids | G02B 6/12004 |
| 11,340,403 | B2 | 5/2022 | Bian et al. | |
| 11,404,596 | B1 * | 8/2022 | Luk | H04B 10/6911 |
| 2007/0104410 | A1 * | 5/2007 | Ahn | H01L 31/125 |
| | | | | 257/E31.012 |

(Continued)

OTHER PUBLICATIONS

Aboketaf et al., "Towards fully automated testing and characterization for photonic compact modeling on 300-mm wafer platform," Optical Fiber Communication Conference (OFC) 2021, OSA Technical Digest, 3 pages.

(Continued)

*Primary Examiner* — Michael Stahl
(74) *Attorney, Agent, or Firm* — Anthony Canale; Hoffman Warnick LLC

(57) ABSTRACT

Disclosed are embodiments of a photonic structure with at least one tapered coupler positioned laterally adjacent and along the length of a sidewall of a layer, such as a light absorption layer (LAL), of a photodetector to facilitate mode matching. Some embodiments include a vertically oriented photodetector, which is on an insulator layer and has an LAL stacked between bottom and top semiconductor layers, and a coupler, which is on the insulator layer positioned laterally adjacent to the photodetector and has stacked cores with one of the cores being at the same level as the LAL. Other embodiments include a horizontally oriented photodetector, which is on an insulator layer and has an LAL on a recessed section of a bottom semiconductor layer between side sections, and coupler(s), which is/are above side section(s) of the bottom semiconductor layer and, thus, positioned laterally adjacent to one or both sides of the LAL.

20 Claims, 10 Drawing Sheets

(56) References Cited

U.S. PATENT DOCUMENTS

| | | | |
|---|---|---|---|
| 2017/0017039 A1* | 1/2017 | Tu | G02B 6/12002 |
| 2019/0074397 A1* | 3/2019 | Hassan | H01L 31/1075 |
| 2020/0124791 A1* | 4/2020 | Bayn | H01L 31/02327 |
| 2021/0013356 A1* | 1/2021 | Huang | G02B 6/12004 |
| 2021/0057592 A1* | 2/2021 | Bian | G02B 6/12004 |
| 2021/0157068 A1* | 5/2021 | Gothoskar | H01L 31/03529 |

OTHER PUBLICATIONS

Bian et al., "3D Integrated Laser Attach Technology on 300-mm Monolithic Silicon Photonics Platform," IEEE Photonics Conference (IPC), 2020, 2 pages.

Bian et al., "Hybrid III-V laser integration on a monolithic silicon photonic platform," Optical Fiber Communication Conference (OFC) 2021, OSA Technical Digest (Optica Publishing Group, 2021), 3 pages.

Bian et al., "Monolithically integrated silicon nitride platform," Optical Fiber Communication Conference (OFC) 2021, OSA Technical Digest (Optica Publishing Group, 2020), 3 pages.

Bian et al., "Towards low-loss monolithic silicon and nitride photonic building blocks in state-of-the-art 300mm CMOS foundry," Frontiers in Optics/Laser Science OSA Technical Digest (Optica Publishing Group, 2020), 2 pages.

Chowdhury et al., "High Performance Avalanche Photodiode in a Monolithic Silicon Photonics Technology," 2022 Optical Fiber Communications Conference and Exhibition (OFC), 3 pages.

Feng et al., "Vertical p-i-n germanium photodetector with high external responsivity integrated with large core Si waveguides," Jan. 4, 2010, Optics Express 96, vol. 18, No. 1., pp. 96-101.

Giewont et al., "300-mm Monolithic Silicon Photonics Foundry Technology," IEEE Journal of Selected Topics in Quantum Electronics, Sep./Oct. 2019, vol. 25, No. 5., 12 pages.

Hu et al., "High-speed and high-power germanium photodetector with a lateral silicon nitride waveguide," May 2021, Photonics Research, vol. 9, No. 5, pp. 749-756.

Liao et al., "36 GHz submicron silicon waveguide germanium photodetector," May 23, 2011, Optics Express, vol. 19, No. 11, pp. 10967-10972.

Martinez et al., "High performance waveguide-coupled Ge-on-Si linear mode avalanche photodiodes," Aug. 22, 2016, Optics Express, vol. 24, No. 17, pp. 19072-19081.

Peng et al., "A CMOS Compatible Monolithic Fiber Attach Solution with Reliable Performance and Self-alignment," in Optical Fiber Communication Conference (OFC) 2020, OSA Technical Digest (Optica Publishing Group, 2020), 3 pages.

Rakowski et al., "45nm CMOS—Silicon Photonics Monolithic Technology (45CLO) for next-generation, low power and high speed optical interconnects," Optical Fiber Communication Conference. Optica Publishing Group, 2020, 3 pages.

Rauch et al., "Reliability Failure Modes of an Integrated Ge Photodiode for Si Photonics," in Optical Fiber Communication Conference (OFC) 2020, OSA Technical Digest (Optica Publishing Group, 2020), paper W2A.5.

Byrd et al., "Mode-evolution-based coupler for high saturation power Ge-on-Si photodetectors," Optics Letters, vol. 42, No. 4, Feb. 15, 2017, pp. 851-854.

Zuo et al., "Integrated high-power germanium photodetectors assisted by light field manipulation," Optics Letters, vol. 44, No. 13, Jul. 1, 2019, 5 pages.

Lee et al., "Automatic Waveguide Balancing Using Point Set Operations," in Optical Fiber Communication Conference (OFC) 2022, Technical Digest Series (Optica Publishing Group, 2022), 3 pages.

* cited by examiner

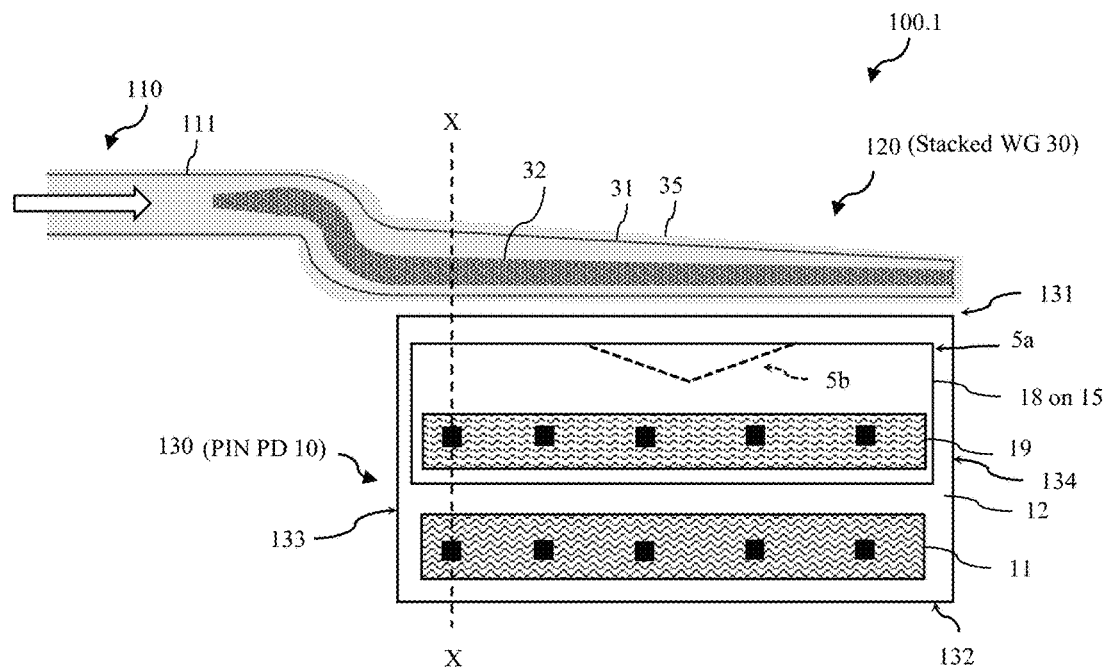
FIG. 1.1A
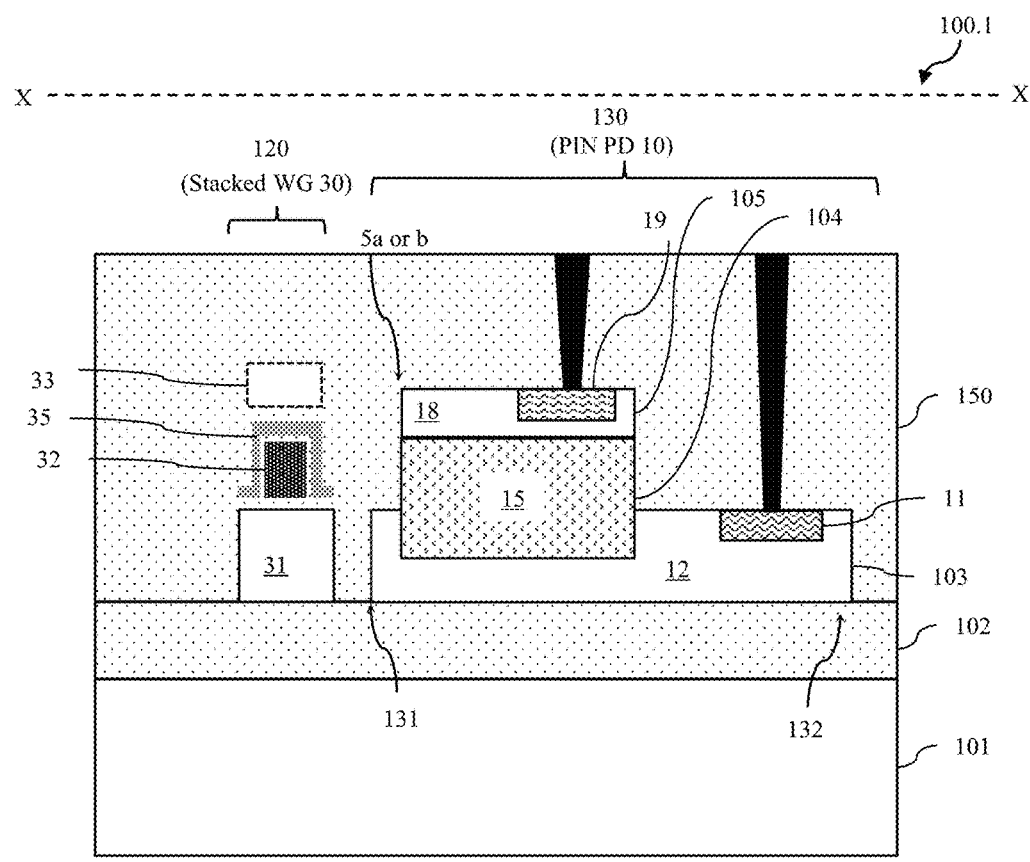
FIG. 1.1B

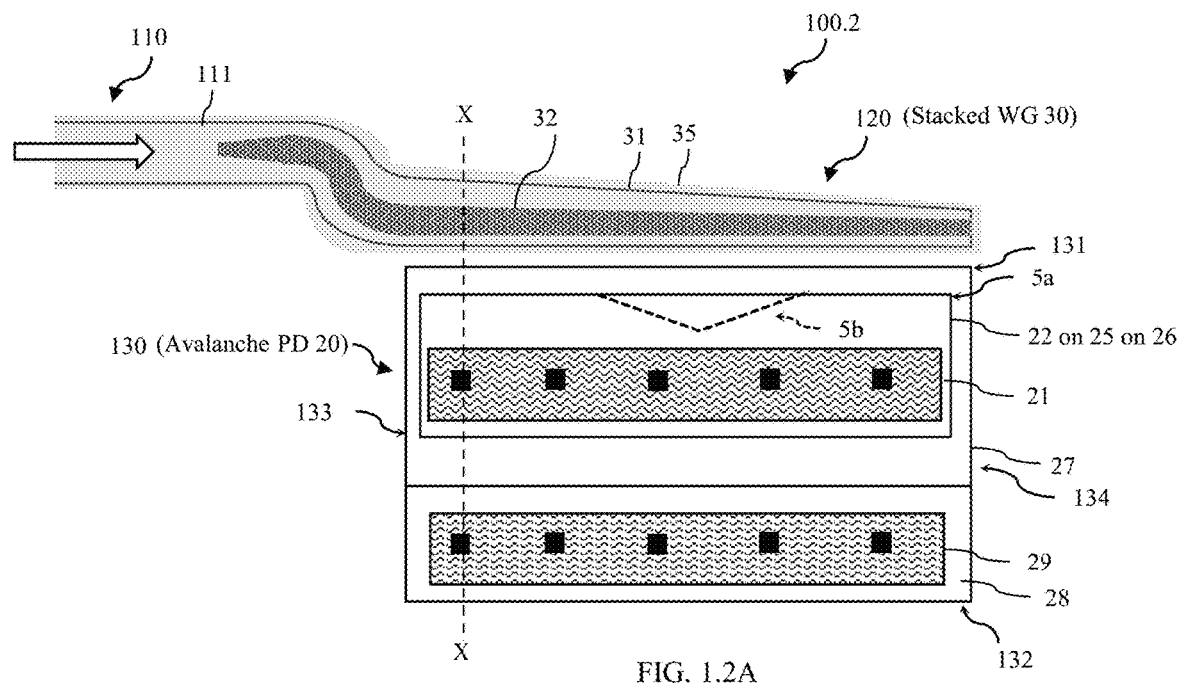
FIG. 1.2A
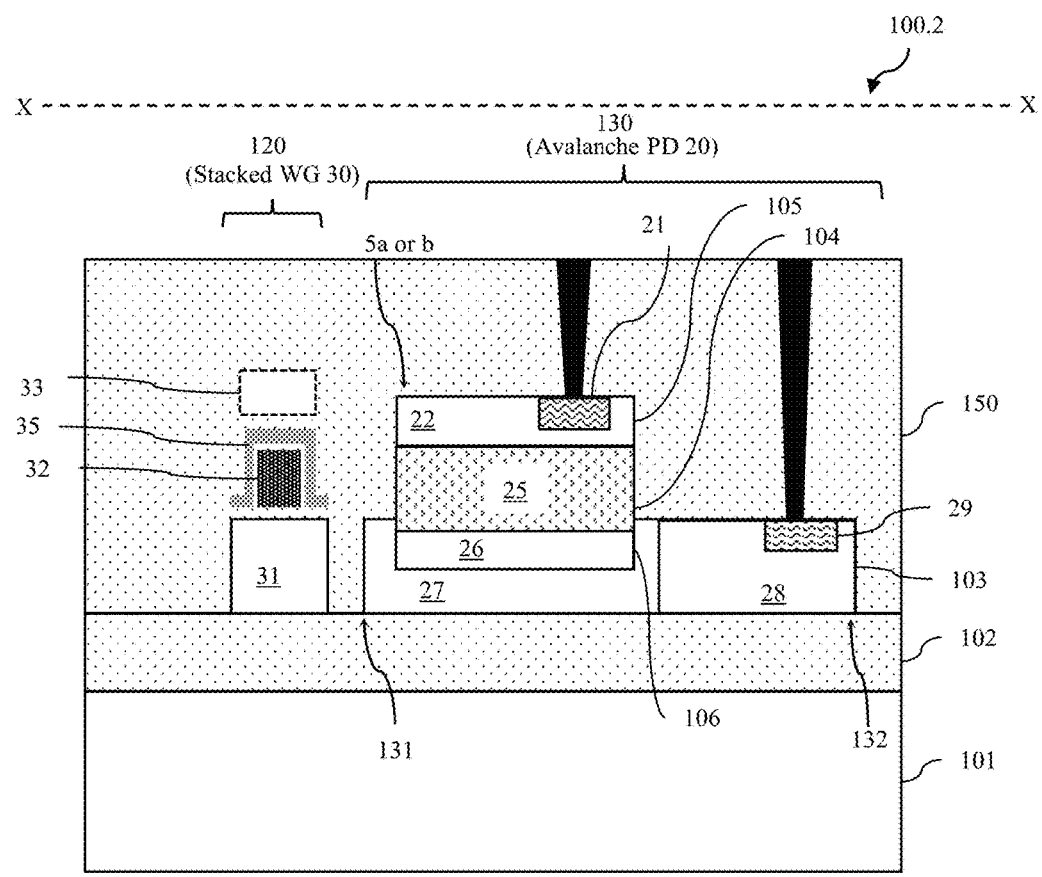
FIG. 1.2B

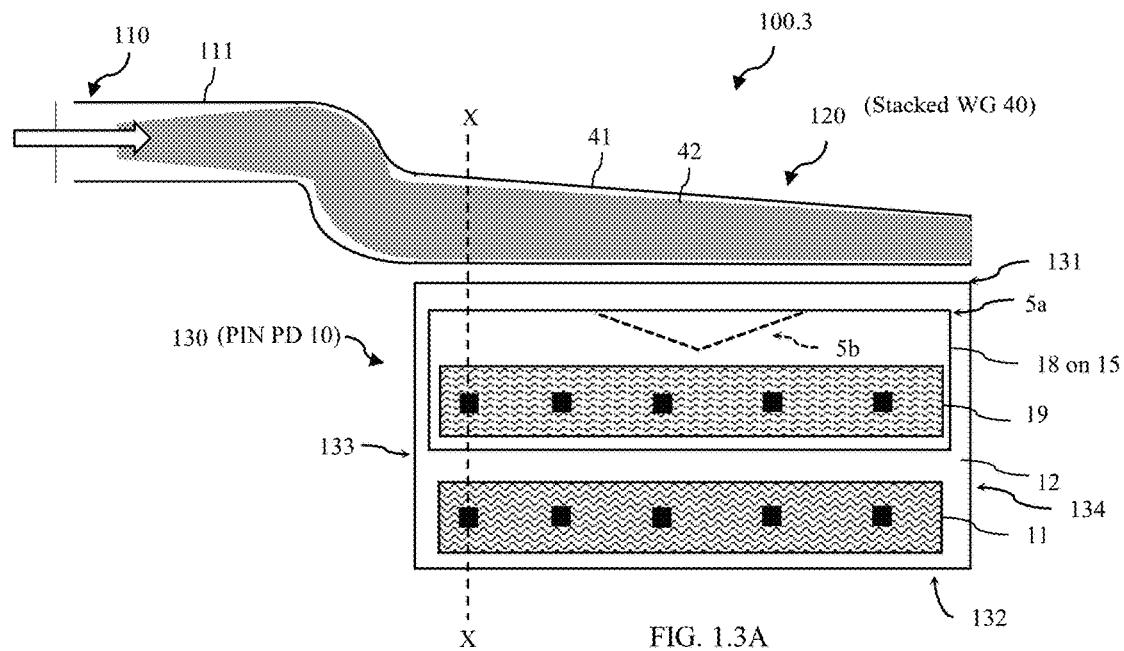
FIG. 1.3A
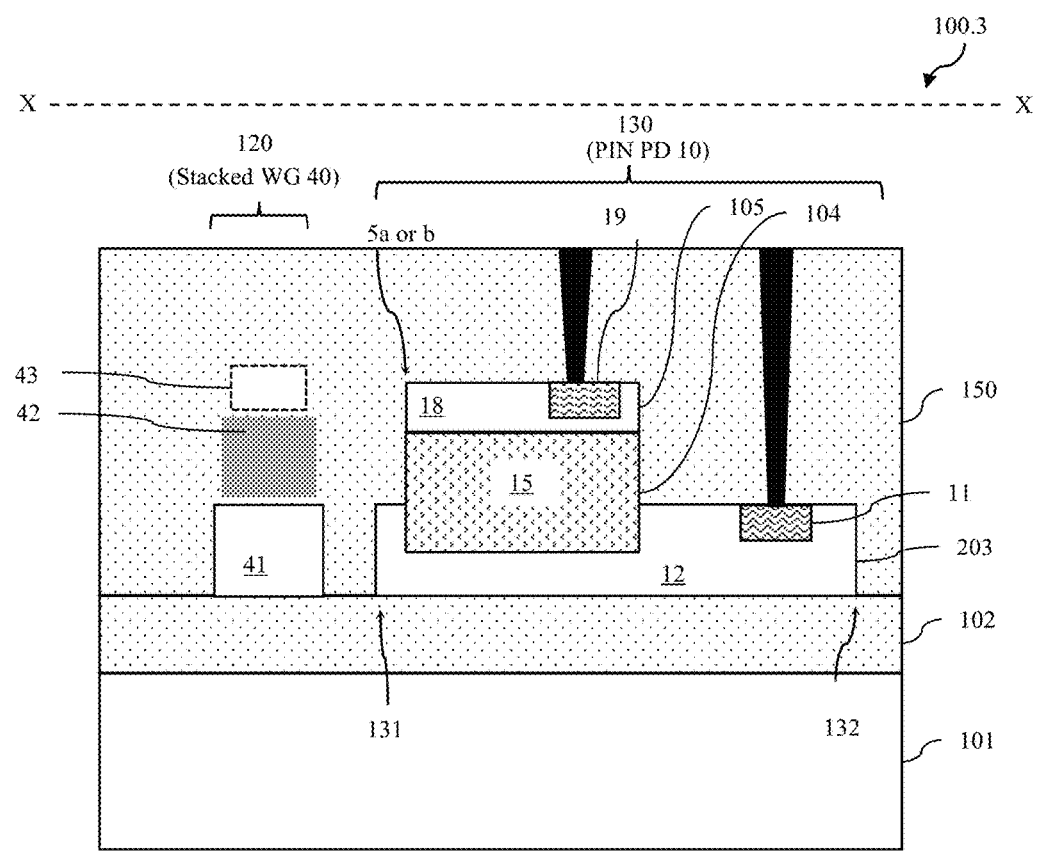
FIG. 1.3B

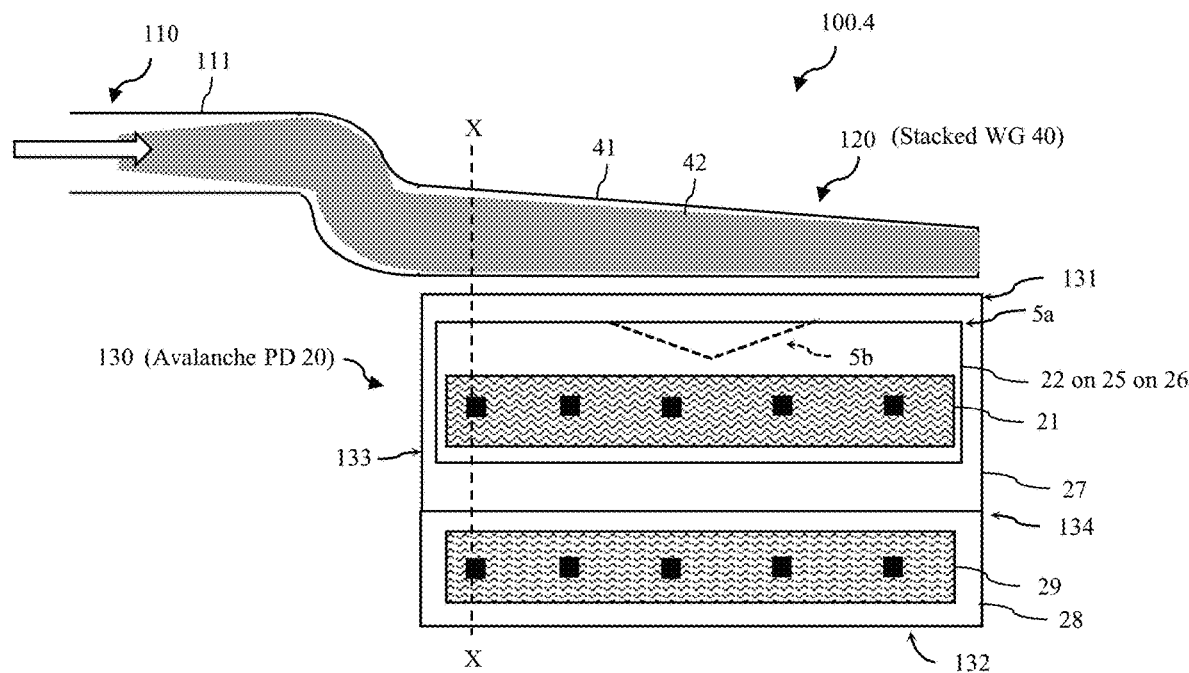
FIG. 1.4A
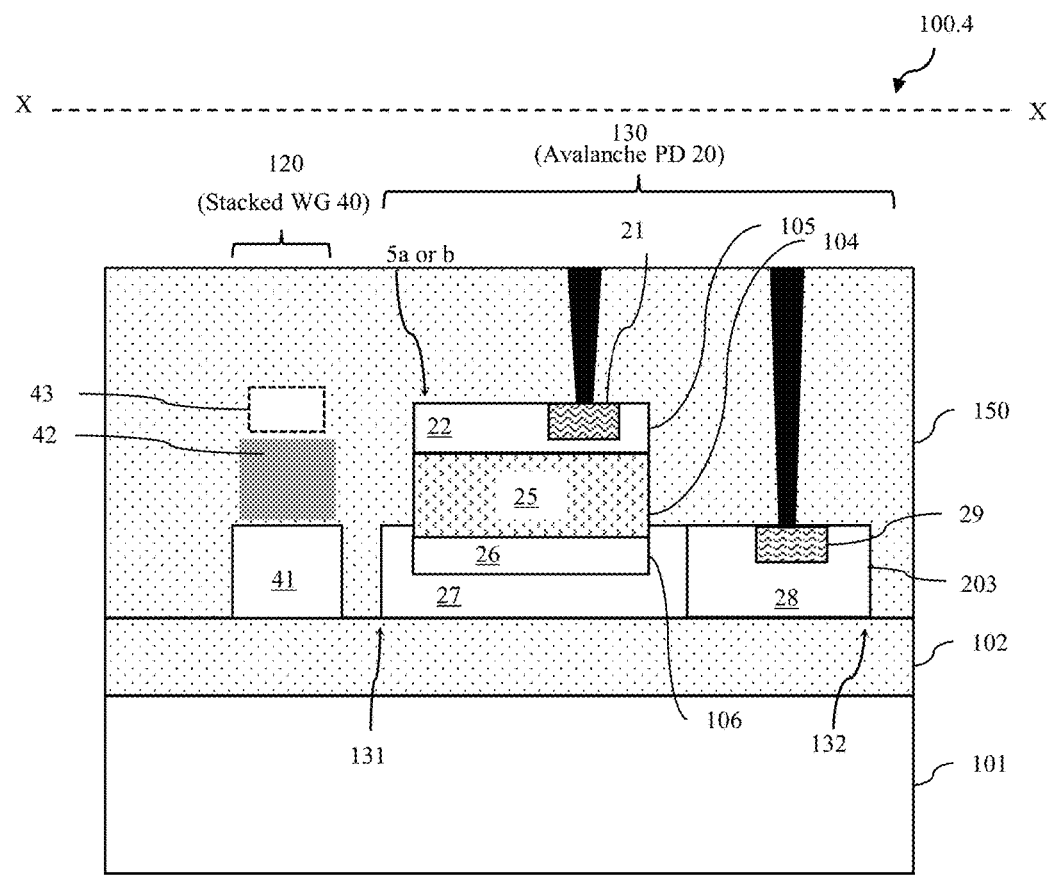
FIG. 1.4B

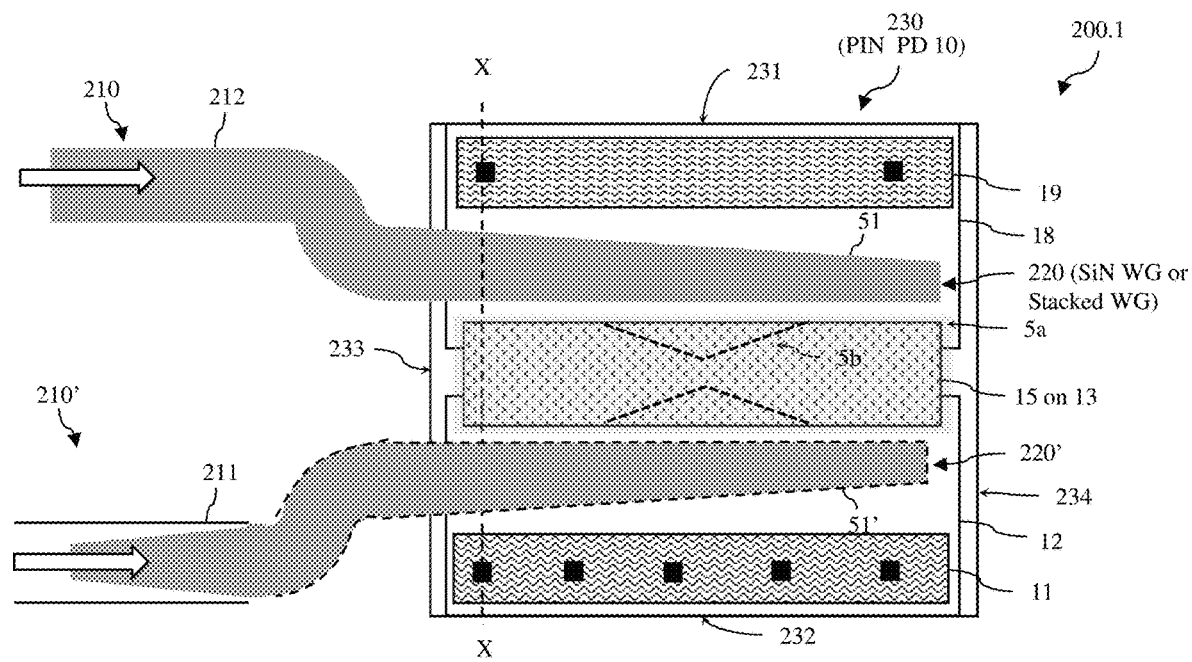
FIG. 2.1A
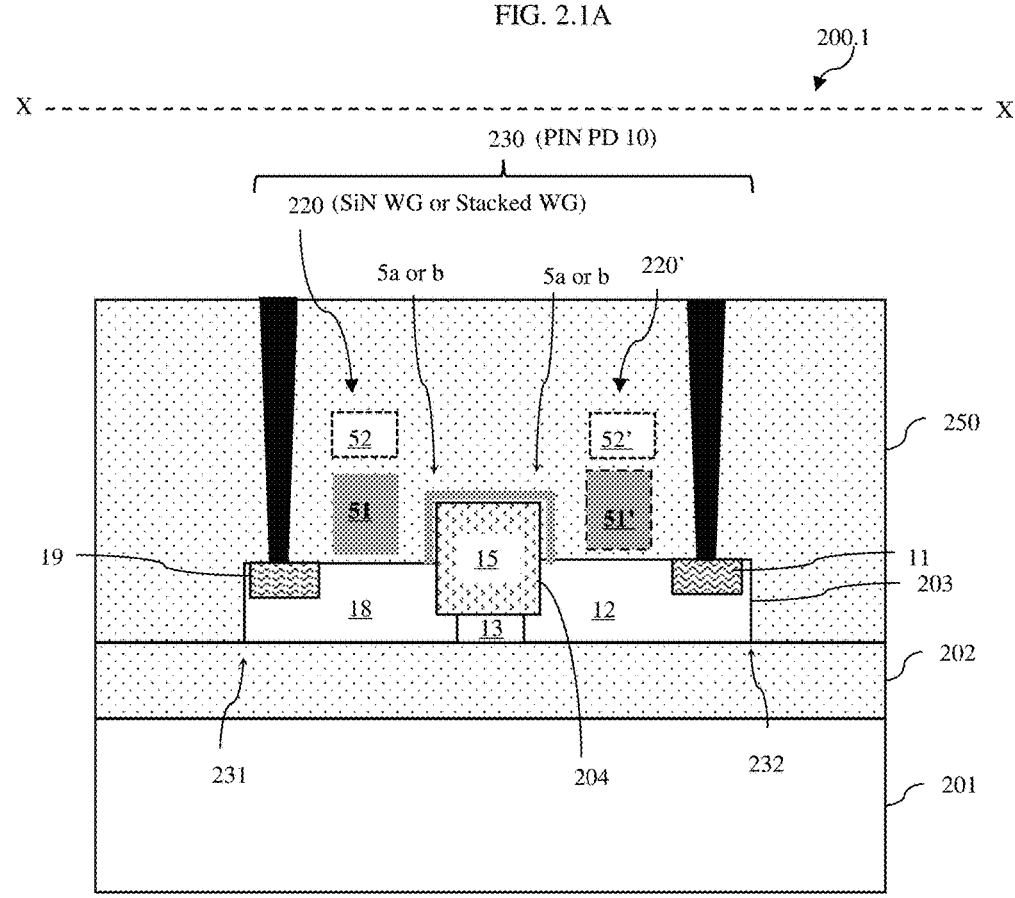
FIG. 2.1B

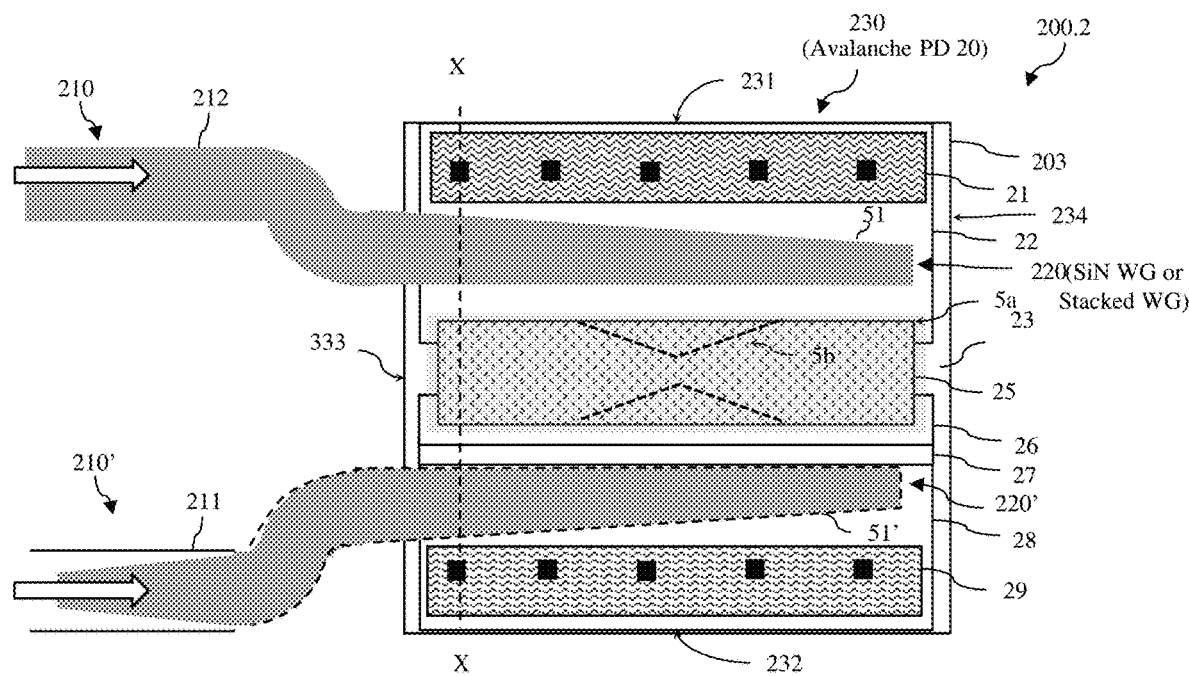
FIG. 2.2A
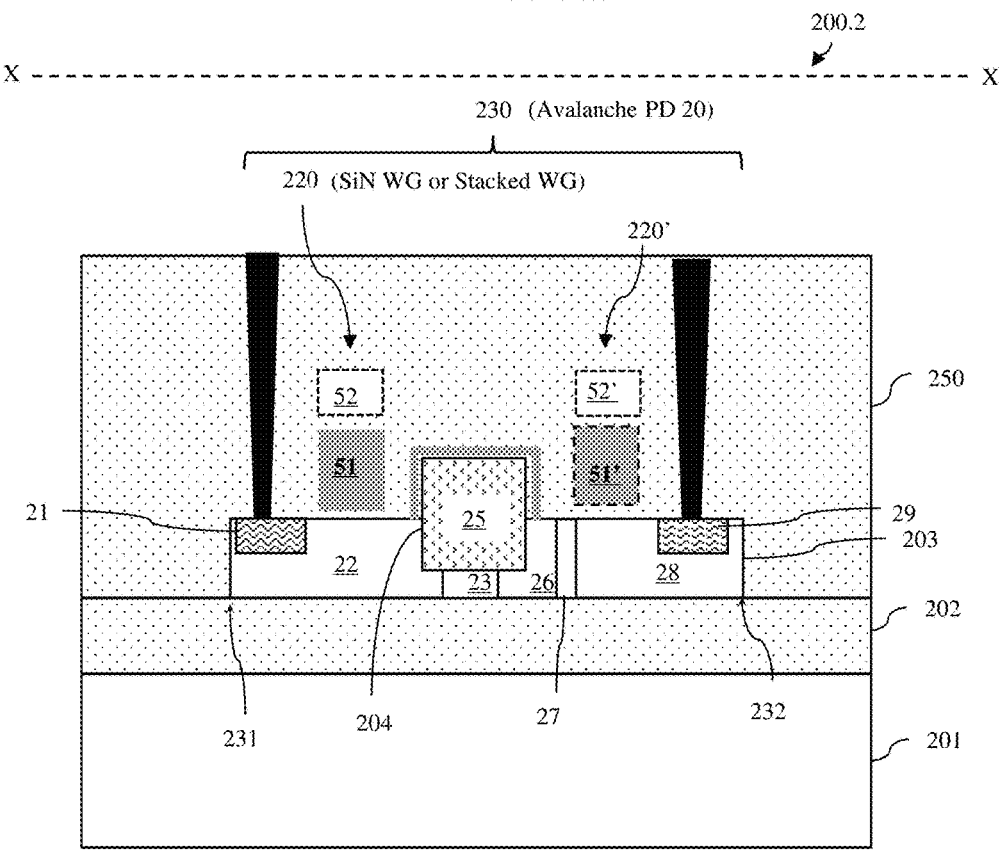
FIG. 2.2B

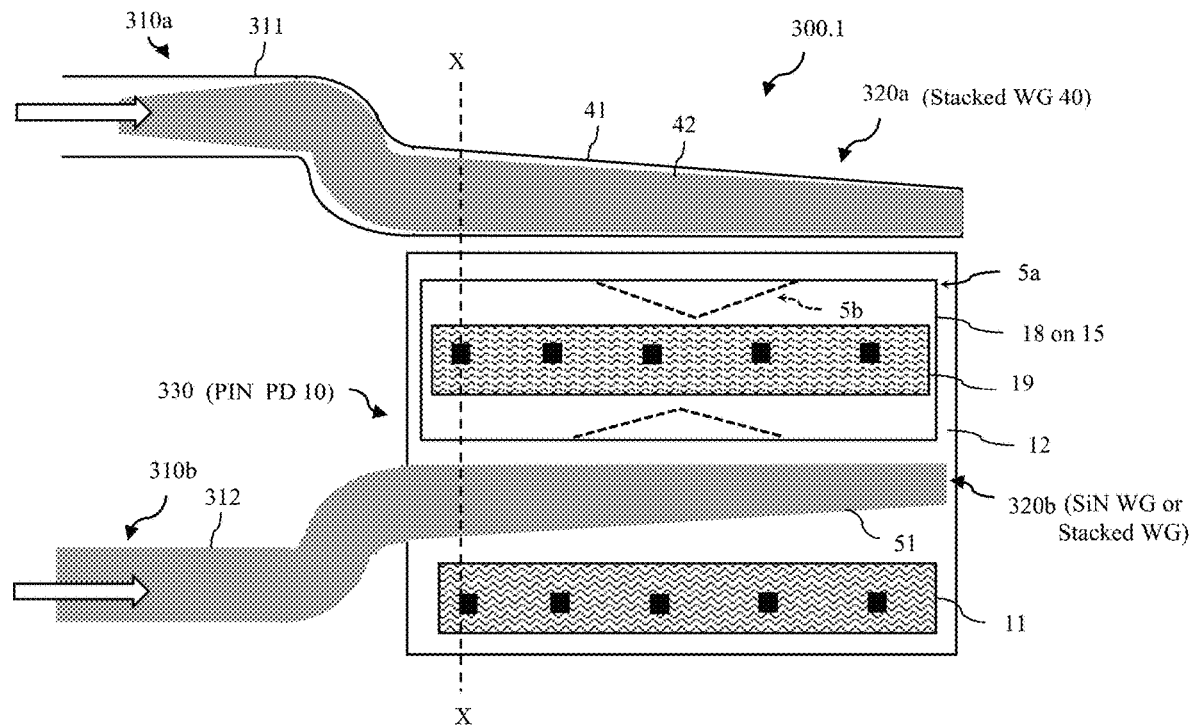
FIG. 3.1A
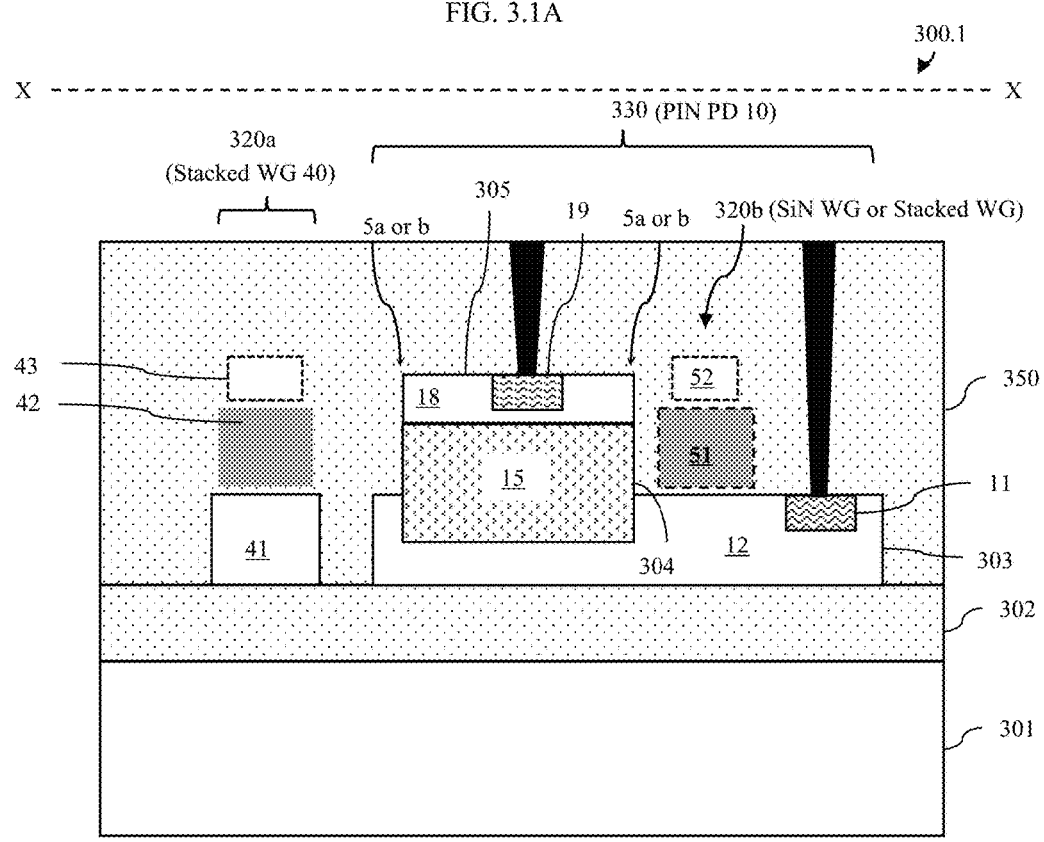
FIG. 3.1B

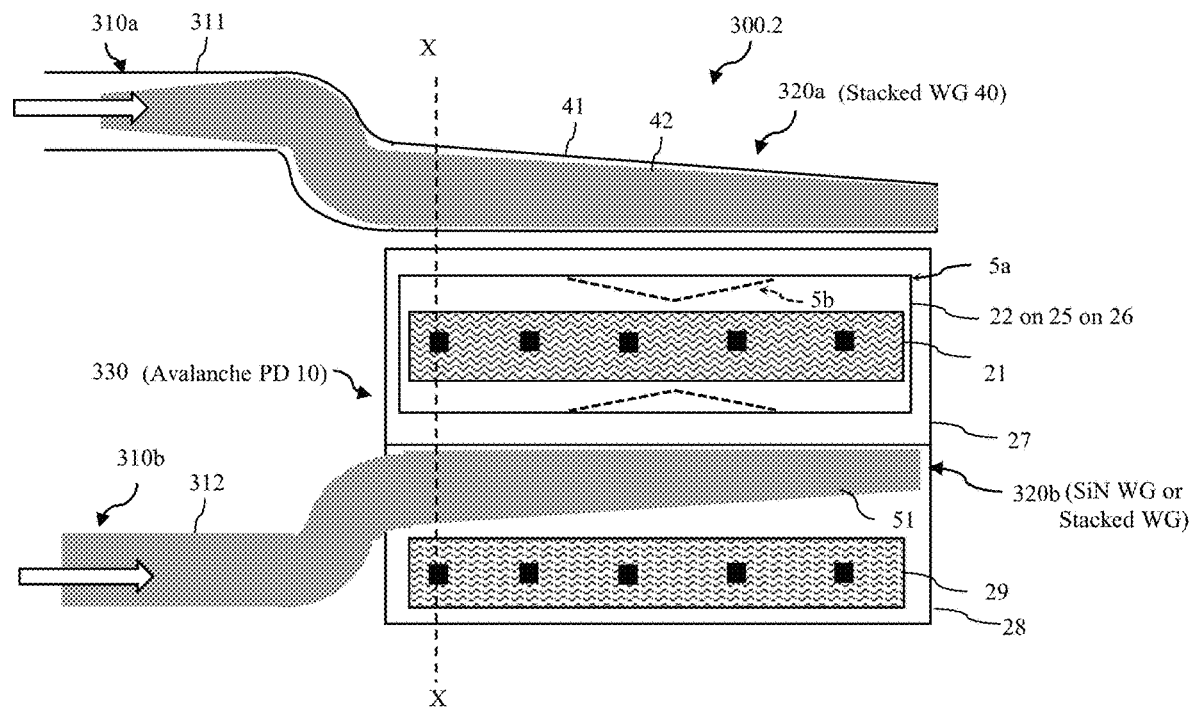
FIG. 3.2A
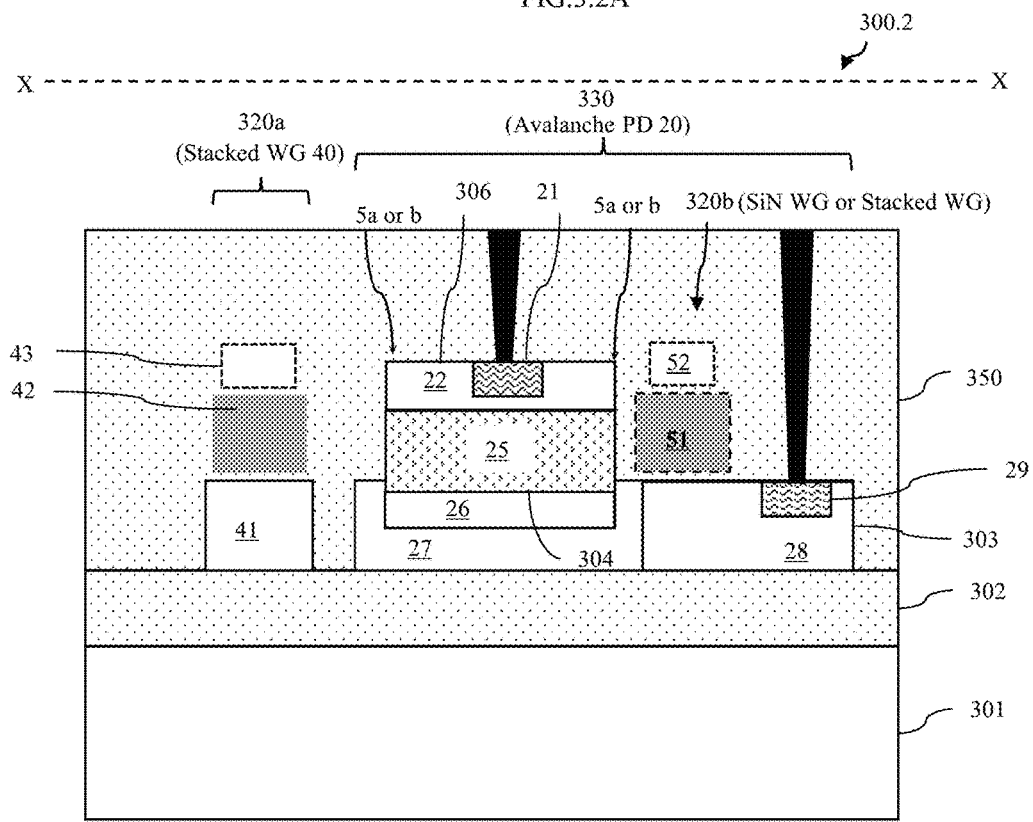
FIG. 3.2B

FIG. 5A
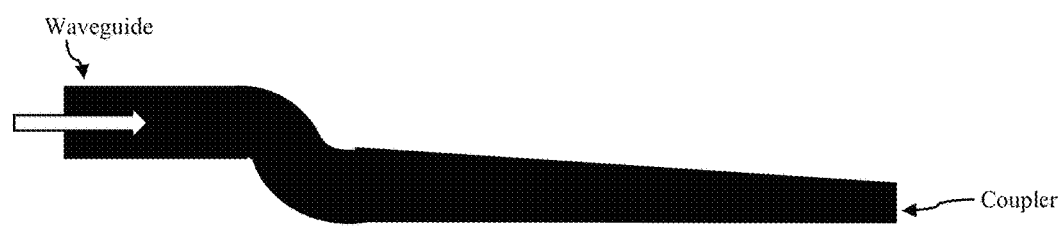
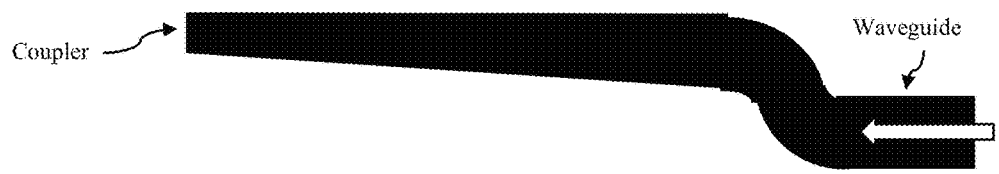
FIG. 5B

PHOTONIC STRUCTURE WITH WAVEGUIDE-TO-PHOTODETECTOR COUPLER ORIENTED ALONG SIDEWALL OF A PHOTODETECTOR

BACKGROUND

The disclosed embodiments relate to photonic structures and, more particularly, to embodiments of a photonic structure with an adiabatic waveguide-to-photodetector coupler.

In photonic structures, a waveguide can be coupled to a photodetector, allowing light signals (i.e., photons) from the waveguide to be received by the photodetector and converted into current. Depending on the material and on the cross-sectional dimension of the waveguide core and further depending on the material and on the cross-sectional dimension of the photodetector light absorption layer, there can be significant mode mismatch that leads to degraded coupling efficiency and reduced photodetector performance. For example, mode mismatches leading to reduced photodetector performance are often seen when a waveguide with a thin silicon (Si) core is coupled to a photodetector with a thick germanium (Ge) or silicon germanium (SiGe) light absorption layer. The mode mismatch may be exacerbated when, within the photodetector, the thick Ge or SiGe light absorption layer is epitaxially grown on a recessed section of a Si layer.

SUMMARY

Disclosed herein are various embodiments of a photonic structure with at least one waveguide-to-photodetector coupler oriented along a sidewall of a polarization-independent photodetector to facilitate mode matching and improve coupling efficiency and, thereby photodetector performance.

In some embodiments disclosed herein a photonic structure can include a photodetector. This photodetector can be vertically oriented and can include multiple semiconductor layers. The multiple semiconductor layers can include at least a first semiconductor layer and a second semiconductor on the first semiconductor layer. The photonic structure can further include a coupler with multiple stacked cores. Specifically, the coupler can include at least a first core positioned laterally adjacent to the first semiconductor layer and a second core positioned laterally adjacent to the second semiconductor layer.

In other embodiments disclosed herein a photonic structure can include a photodetector. This photodetector can be horizontally oriented and can include a first semiconductor layer and a second semiconductor layer. The first semiconductor layer can have side sections and a center section positioned laterally between the side sections. The second semiconductor layer can be on the center section of the first semiconductor layer. The photonic structure can further include a coupler on a side section of the photodetector positioned laterally adjacent to the second semiconductor layer.

In other embodiments disclosed herein a photonic structure can have a combination of the features mentioned in the embodiments described above. That is, the photonic structure can include a photodetector. This photodetector can be vertically oriented and can include three semiconductor layers. The three semiconductor layers can include; a first semiconductor layer, a second semiconductor layer and, particularly, an intrinsic semiconductor layer on the first semiconductor layer, and a third semiconductor layer on the second semiconductor layer. The photonic structure can further include two couplers. The couplers can include one coupler with multiple stacked cores including at least a first core positioned laterally adjacent to the first semiconductor layer and a second core positioned laterally adjacent to the second semiconductor layer. The couplers can further include an additional coupler with an additional core on the additional section of the first semiconductor layer (i.e., so that the second semiconductor layer is positioned laterally between the two couplers).

BRIEF DESCRIPTION OF THE DRAWINGS

The disclosed embodiments will be better understood from the following detailed description with reference to the drawings, which are not necessarily drawn to scale and in which:

FIGS. 1.1A and 1.1B are layout and cross-section diagrams, respectively, of an embodiment of a photonic structure with a vertically oriented photodetector and a coupler on the side of the photodetector;

FIGS. 1.2A and 1.2B are layout and cross-section diagrams, respectively, of another embodiment of a photonic structure with a vertically oriented photodetector and a coupler with a stacked WG structure;

FIGS. 1.3A and 1.3B are layout and cross-section diagrams, respectively, of another embodiment of a photonic structure with a vertically oriented photodetector and a coupler with a stacked WG structure;

FIGS. 1.4A and 1.4B are layout and cross-section diagrams, respectively, of yet another embodiment of a photonic structure with a vertically oriented photodetector and a coupler with a stacked WG structure;

FIGS. 2.1A and 2.1B are layout and cross-section diagrams, respectively, of an embodiment of a photonic structure with a horizontally oriented photodetector and a coupler(s) thereon;

FIGS. 2.2A and 2.2B are layout and cross-section diagrams, respectively, of another embodiment of a photonic structure with a horizontally oriented photodetector and coupler(s) thereon;

FIGS. 3.1A and 3.1B are layout and cross-section diagrams, respectively, of an embodiment of a photonic structure with a vertically oriented photodetector and couplers on and to the side of the photodetector;

FIGS. 3.2A and 3.2B are layout and cross-section diagrams, respectively, of another embodiment of a photonic structure with a vertically oriented photodetector and couplers on and to the side of the photodetector;

FIGS. 5A-5B are drawings illustrating optional positioning couplers in the multi-coupler embodiments described above.

DETAILED DESCRIPTION

Figure 4A:
FIGS. 4A-4D are drawings illustrating coupler and adjacent waveguide shapes.

As mentioned above, in photonic structures, a waveguide can be coupled to a photodetector, allowing light signals (i.e., photons) from the waveguide to be received by photodetector and converted into current. Depending on the material and on the cross-sectional dimension of the waveguide core and further depending on the material and on the cross-sectional dimension of the photodetector light absorption layer, there can be significant mode mismatch that leads to degraded coupling efficiency and reduced photodetector performance. For example, mode mismatches leading to reduced photodetector performance are often seen when a waveguide with a thin silicon (Si) core is coupled to a photodetector with a thick germanium (Ge) or silicon germanium (SiGe) light absorption layer. The mode mismatch may be exacerbated when, within the photodetector, the thick Ge or SiGe light absorption layer is epitaxially grown on a recessed section of a Si layer.

In view of the foregoing, disclosed herein are various embodiments of a photonic structure with at least one waveguide-to-photodetector coupler oriented along a sidewall of a layer of a polarization-independent photodetector (e.g., a PIN photodiode, an avalanche photodiode, or any other type of polarization-independent photodetector) to facilitate mode matching and improve coupling efficiency and, thereby photodetector performance. As shown in FIGS. 1.1A-1.4B, some photonic structure embodiments 100.1-100.4 can include a vertically oriented polarization-independent photodetector, which is on an insulator layer and has a light absorption layer stacked between bottom and top semiconductor layers, and a tapered adiabatic optical coupler, which is on the insulator layer positioned laterally adjacent to one side of the photodetector and has stacked cores with one of the cores being at approximately the same level as the light absorption layer.

As shown in FIGS. 2.1A-2.2B, other photonic structure embodiments 200.1-200.2 can include a horizontally oriented polarization-independent photodetector, which is on an insulator layer and has a light absorption layer on a recessed section of a bottom semiconductor layer between two side sections, and adiabatic optical coupler(s), which is/are above side section(s) of the bottom semiconductor layer and, thus, positioned laterally adjacent to one or both sides of the light absorption layer. As shown in FIGS. 3.1A-3.2B, still other photonic structure embodiments 300.1-300.2 can include a combination of some of the features of the previously described embodiments. For example, a photonic structure can include a vertically oriented polarization-independent photodetector, which is on an insulator layer and includes a bottom semiconductor layer with a recessed section and an additional section positioned laterally thereto, a light absorption layer on the recessed section, and a top semiconductor layer on the light absorption layer. This photonic structure can also include an adiabatic optical coupler, which is on the insulator layer positioned laterally adjacent to one side of the photodetector and includes stacked cores, and another adiabatic optical coupler, which is on the additional section of the bottom semiconductor layer.

For purposes of this disclosure, a waveguide is a structure that propagates light signals. To facilitate and control optical signal propagation, a waveguide includes a core and cladding, which covers the surfaces of the core, and which is made of a material that has a smaller refractive index than the material used for the core. The function of the cladding material is to confine the optical signals within the waveguide core by reflecting the signals at interfaces between the two materials. Confinement can be strengthened by increasing the refractive index contrast between the core and cladding materials.

Those skilled in the art will recognize that mode matching is required for transmission of light signals between optical devices (e.g., between waveguides, between a waveguide and a photodetector, etc.). Light signals can be transverse electric (TE)-mode light signals, transverse magnetic (TM)-mode light signals, or both TE-mode and TM-mode light signals. The mode is generally determined by the refractive index profile of the optical device at issue and its cross-sectional geometric size and shape. For optical devices with adjacent core materials having the same refractive index profiles, mode matching between the core materials generally occurs at a location where the adjacent core materials have cross-sectional areas that are approximately the same. For optical devices with adjacent core materials having different refractive index profiles, mode matching may occur at a location where the adjacent core materials have different cross-sectional areas but the same propagation constant (which is determined by the respective combinations of refractive index and cross-sectional area). On the other hand, an optical waveguide of certain material type, geometric size, etc. may have a certain threshold of power level that it can accommodate, and power transmission fails have been noted when optical signals are at relatively high optical power levels (i.e., above the threshold).

Additionally, for purposes of this disclosure, "polarization-independent" photodetector refers to a photodetector configured to receive light signals (i.e., photons) from a waveguide (or coupler) and convert the light signals into current, regardless of the mode of those light signals (i.e., regardless of whether the received light signals include transverse electric (TE)-mode light signals, transverse magnetic (TM)-mode light signals, or both TE-mode and TM-mode light signals). As discussed in greater detail below, such a photodetector can be, for example, a PIN photodiode (PD) 10 or an avalanche PD 20. Additionally, for purposes of this disclosure, an optical coupler is a waveguide (WG) structure, which includes at least one core wrapped by cladding material and which facilitates optical coupling between two other optical devices. That is, an optical coupler receives light signals at one end from one optical device, propagates the light signal along the core(s) therein, and transmits the light signals to another optical device. In the photonic structures disclosed herein, an optical coupler specifically facilitates and controls light signal transmission between a waveguide and a photodetector and, thus, is referred to as a waveguide-to-photodetector coupler. For purposes of this disclosure, an "adiabatic" optical coupler refers to a low-loss optical coupler or, more particularly, an optical coupler that, when employed to couple to other optical devices (e.g., a waveguide and a photodetector) facilitates light signal transmission between the optical devices with minimal or low power loss.

FIGS. 1.1A and 1.1B are layout and cross-section diagrams, respectively, of a photonic structure 100.1. FIGS. 1.2A and 1.2B are layout and cross-section diagrams, respectively, of a photonic structure 100.2. FIGS. 1.3A and 1.3B are layout and cross-section diagrams, respectively, of a photonic structure 100.3. FIGS. 1.4A and 1.4B are layout and cross-section diagrams, respectively, of a photonic structure 100.4.

Referring to FIGS. 1.1A-1.4B, each photonic structure 100.1, 100.2, 100.3 and 100.4 can include a vertically oriented polarization-independent photodetector (simply "photodetector" hereafter) 130, which is on an insulator layer and has a light absorption layer stacked between bottom and top semiconductor layers, and an adiabatic optical coupler 120, which is on the insulator layer positioned laterally adjacent to one side of photodetector 130 and has stacked cores with one of the cores being at approximately the same level as the light absorption layer. As discussed in greater detail below, the photonic structures 100.1-100.4 vary with respect to the configurations of photodetector 130 (e.g., a PIN PD 10, as shown in the photonic structures 100.1 of FIGS. 1.1A-1.1B and 100.3 of FIGS. 1.3A-1.3B, or an avalanche PD 20, as shown in the photonic structures 100.2 of FIGS. 1.2A-1.2B and 100.4 of FIGS.

1.4A-1.4B) and/or with respect to the adiabatic optical coupler 120 (e.g., a stacked waveguide (WG) structure 30, as shown in the photonic structure 100.1 of FIGS. 1.1A-1.1B and the photonic structure 100.2 of FIGS. 1.2A-1.2B, or a stacked WG structure 40, as shown in the photonic structure 100.3 of FIGS. 1.3A-1.3B and the photonic structure 100.4 of FIGS. 1.3A-1.3B).

More particularly, each photonic structure 100.1-100.4 can include a substrate 101. This substrate 101 can be a semiconductor substrate, such as a monocrystalline silicon (cSi) substrate or some other suitable semiconductor substrate. Each photonic structure 100.1-100.4 can further include an insulator layer 102 on the substrate 101. The insulator layer 102 can be, for example, a silicon dioxide (SiO$_2$) layer (also referred to herein as a buried oxide (BOX) layer) or a layer of some other suitable insulator material.

Each photonic structure 100.1-100.4 can further include a vertically oriented polarization-independent photodetector 130 on the insulator layer 102.

Specifically, the photodetector 130 can include a first semiconductor layer 103 that is above and immediately adjacent to the top surface of insulator layer 102. The first semiconductor layer 103 can be patterned to be essentially rectangular in shape with opposing first sidewalls 131 and 132 and opposing first end walls 133-134. Additionally, the first semiconductor layer 103 can include two immediately adjacent sections. As illustrated, the two sections can include a recessed section on one side (e.g., at the first sidewall 131) and having a recess therein and an additional section positioned laterally adjacent to the recessed section (e.g., at the second sidewall) and without a recess therein. Alternatively, the top surface of the first semiconductor layer 103 can be essentially planar across the two sections. In any case, this first semiconductor layer 103 can be, for example, a monocrystalline semiconductor layer, such as a monocrystalline silicon (cSi) layer or a layer of some other currently known or later developed monocrystalline semiconductor material.

The photodetector 130 can further include a second semiconductor layer 104 on one section of the first semiconductor layer 103 (e.g., on the recessed section). As illustrated, the first semiconductor layer 103 can be wider than the second semiconductor layer 104 such that the additional section of the first semiconductor layer 103 extends laterally beyond the second semiconductor layer 104. The second semiconductor layer 104 can have opposing second sidewalls oriented in essentially the same direction as the opposing first sidewalls 131-132 and opposing second end walls oriented in essentially the same direction as the opposing first end walls 133-134. The opposing second sidewalls can be essentially planar as they extend between the opposing second end walls (e.g., see solid line 5a) such that the width of the second semiconductor layer is essentially uniform from end-to-end. However, alternatively, at least one of the second sidewalls and, particularly, at least the second sidewall proximal to the first sidewall 131 can be V-shaped as it extends between the opposing second end walls (e.g., see dashed line 5b) such that the width of the second semiconductor layer 104 tapers down from the end portions toward the center portion. In any case, this second semiconductor layer 104 can specifically be an intrinsic semiconductor layer (i.e., an undoped semiconductor layer) and can function as the light absorption layer (LAL) of the photodetector 130. This second semiconductor layer 104 can be, for example, an epitaxially grown monocrystalline semiconductor layer of germanium (Ge), silicon (Si), silicon germanium (SiGe), or some other currently known or later developed light absorbing semiconductor material.

The photodetector 130 can further include a third semiconductor layer 105 on the top surface of the second semiconductor layer 104. The sidewalls and end walls of the third semiconductor layer 105 can be vertically aligned with the sidewalls and the end walls of the second semiconductor layer 104. This third semiconductor layer 105 can be, for example, an epitaxially grown monocrystalline semiconductor layer of the same semiconductor material used for the first semiconductor layer 103 (e.g., cSi) or of some other currently known or later developed monocrystalline semiconductor material.

As mentioned above, the photodetector 130 in the photonic structure 100.1 of FIGS. 1.1A-1.1B and the photonic structure 100.3 of FIGS. 1.3A-1.3B can specifically be a PIN PD 10. The PIN PD 10 can include a P-doped region 12, an N-doped region 18, and an intrinsic region 15 (i.e., an undoped region, which is the light absorption region, also referred to as the photon absorption region) between the P-doped region 12 and N-doped region 18. In this case, the doped regions with the different conductivity types can be in the first and third semiconductor layers. That is, the first semiconductor layer 103 can be doped to have a first-type conductivity at a relatively high conductivity level and the additional section thereof can include a first contact region with the same first-type conductivity at an even higher conductivity level. Additionally, the third semiconductor layer 105 can be doped to have a second-type conductivity (which is different from the first-type conductivity) at a relatively high conductivity level and can also include a second contact region with the same second-type conductivity at an even higher conductivity level. Thus, for example, the first semiconductor layer 103 can be doped to have P-type conductivity for the P-doped region 12 and the additional section thereof can further include a P+ contact region 11 therein. The bottom surface of the second semiconductor layer 104 can be on the recessed section of the first semiconductor layer 103. The third semiconductor layer 105 can be on the top surface of the second semiconductor layer 104, can be doped to have N-type conductivity for the N-doped region 18, and can further include an N+ contact region 19 therein. Since, as mentioned above, the second semiconductor layer 104 is an intrinsic semiconductor layer, the resulting structure includes an intrinsic region 15 stacked vertically between a P-doped region 12 with a P+ contact region 11 therein and an N-doped region 18 with an N+ contact region 19 therein. For purposes of illustration, the PIN PD 10 is described above and illustrated in the figures with the P-doped region being in the first semiconductor layer and the N-doped region being in the third semiconductor layer. However, it should be understood that the description and figures are not intended to be limiting and that, alternatively, the N-doped region could be in the first semiconductor layer and the P-doped region could be in the third semiconductor layer.

Also, as mentioned above, the photodetector 130 in the photonic structure 100.2 of FIGS. 1.2A-1.2B and the photonic structure 100.4 of FIGS. 1.4A-1.4B can specifically be an avalanche PD 20. The avalanche PD 20 can, like the PIN PD 10, include a P-doped region 22, an N-doped region 28, and an intrinsic region 25 between the P-doped region 22 and N-doped region 28. However, the avalanche PD 20 can further include, inserted between the N-doped region 28 and the intrinsic region 25, an additional intrinsic region 27 (referred to as a multiplication region) and an additional P-doped region 26 (referred to as a charge region). Thus, for example, the first semiconductor layer 103 can include, within the additional section, an N-type region (i.e., an N-dope region 28) adjacent to the first sidewall 132 and, within the N-doped region 28, an N-type contact region (i.e., an N+ contact region 29). The first semiconductor layer 103 can further include, within the recessed section, an intrinsic region that extends at least partially into the additional section so as to be positioned laterally immediately adjacent to the N-doped region 28. The avalanche PD 20 can further include an additional semiconductor layer 106 stacked vertically between the recessed section of the first semiconductor layer 103 and the second semiconductor layer 104. This additional semiconductor layer 106 can be, for example, an epitaxially grown monocrystalline semiconductor layer of the same semiconductor material used for either the first semiconductor layer 103 (e.g., cSi), the second semiconductor layer 104 (e.g., Si, Ge, or SiGe) or any other currently known or later developed semiconductor material. In any case, this additional semiconductor layer 106 can be doped to have P-type conductivity at a relatively high conductivity level (i.e., to form the additional P-doped region 26). The third semiconductor layer 105 can be on the top surface of the second semiconductor layer 104, can be doped to have P-type conductivity for the P-doped region 22, and can further include a P-type contact region therein (i.e., a P+ contact region 21). Those skilled in the art will recognize that such avalanche PDs provide internal multiplication gain and higher sensitivity over other types of photodetectors (e.g., PIN PDs).

Each photonic structure 100.1-100.4 can further include an adiabatic optical coupler 120 on the insulator layer 102 and positioned laterally adjacent to one side of photodetector 130 and, more particularly, oriented along the first sidewall 131 of the first semiconductor layer 103 and, thereby proximal to the recessed section of the first semiconductor layer 103 and the second sidewall of the second semiconductor layer 104 thereon and distal from the additional section. In each of these embodiments, the optical coupler 120 can specifically be a stacked WG structure. For purposes of this disclosure, a stacked WG structure is made up of at least two cores (e.g., a first core, a second core, and optionally one or more additional cores) that are stacked vertically, surrounded by cladding material, and physically separated by a thin layer of cladding material (e.g., SiO2 or some other currently known or later developed cladding material, as discussed in greater detail below).

As mentioned above, in the photonic structure 100.1 of FIGS. 1.1A-1.1B and the photonic structure 100.2 of FIGS. 1.2A-1.2B, the tapered adiabatic optical coupler 120 is a stacked WG structure 30 and in the photonic structure 100.3 of FIGS. 1.3A-1.3B and the photonic structure 100.4 of FIGS. 1.3A-1.3B, the tapered adiabatic optical coupler 120 is a stacked WG structure 40. In the stacked WG structure 30 and in the stacked WG structure 40, the first core 31, 41 is on the insulator layer 102, made of the same monocrystalline semiconductor material as the first semiconductor layer 103 (e.g., cSi), and is essentially the same height as the additional section (i.e., the non-recessed section) of the first semiconductor layer 103. Furthermore, the second core 32, 42 is stacked above the first core 31, 41 and positioned laterally adjacent to the second semiconductor layer 104. The first core 31, 41 and the second core 32, 42 are made of different materials. Additionally, the second core 32, 42 and the second semiconductor layer 104 are made of different materials.

More specifically, the stacked WG structure 30 can further include a second core 32 above the first core 31. The second core 32 can be, for example, a polycrystalline semiconductor core, such as a polysilicon core. The stacked WG structure 30 can further include an optional third core 33 stacked above the second core 32 and optional additional core(s) (not shown) stacked above the third core 33. The optional third core 33 and additional core(s) can be made of some other suitable relatively high refractive index material. Such high refractive index materials can include, but are not limited to, silicon nitride (SiN), silicon carbon nitride (SiCN), silicon oxynitride (SiON), aluminum nitride (AlN), gallium nitride (GaN), alumina (Al2O3) or some other suitable high refractive index material. Optionally, the stacked WG structure 30 can further include a conformal dielectric layer 35 (e.g., a conformal SiN layer) adjacent to the top surface and sidewalls of the second core 32 and, optionally, separated therefrom and from the above third core 33 (if present) by SiO2.

The stacked WG structure 40 can further include a second core 42 above the first core 41. The second core 42 can be, for example, a SiN core. The stacked WG structure 40 can further include an optional third core 43 stacked above the second core 42 and optional additional core(s) (not shown) stacked above the third core 43. The optional third core 43 and any additional cores can be made of some other suitable relatively high refractive index material. Such high refractive index materials can include, but are not limited to, silicon nitride (SiN), silicon carbon nitride (SiCN), silicon oxynitride (SiON), aluminum nitride (AlN), gallium nitride (GaN), alumina (Al2O3) or some other suitable high refractive index material.

Figure 4B:
Figure 4C:
Figure 4D:

It should be noted that the coupler 120 extends from one end of photodetector 130 toward, to, or even past the opposite end along one side. Additionally, it is tapered from one end toward or to the opposite end. As illustrated in FIGS. 4A-4D, the taper can be linear or non-linear and, optionally, one or both ends of the coupler can be curved (e.g., away from the photodetector). In the stacked WG structure 30, 40 of the coupler, each core can be tapered, as illustrated. Each core can have the same area dimensions or different area dimensions (e.g., different cores can have different maximum and/or minimum width and/or different maximum and/or minimum lengths). Thus, for example, as illustrated, the first core 31, 41 and the second core 32, 42 can both be tapered in the same direction, but the second core 32, 42 can be narrower in width than the first core 31, 41 across the full length of the coupler. Alternatively, at least one core (e.g., the second core 32, 42) can be tapered and at least one core (e.g., the first core 31, 41) can be non-tapered.

Each photonic structure 100.1-100.4 can further include a waveguide 110 coupled to the wide end of coupler 120 and, thereby to the photodetector 130 so that light signals from the waveguide 110 can be received and processed by the photodetector 130. The waveguide 110 can include a core 111 above and immediately adjacent to the insulator layer 102. The core 111 of this waveguide 110 and the first core 31, 41 of the stacked WG structure 30, 40 of coupler 120 can be continuous portions of the same monocrystalline semiconductor material (e.g., cSi). That is, they can be patterned from the same semiconductor material layer without being separated into discrete structures. Thus, light signals will readily pass from the waveguide 110 into the first core of the stacked WG structure.

In the photonic structures 100.1-100.4, mode matching (e.g., TM-mode matching or TE-mode matching) can occur between the waveguide 110 and the coupler 120. Additionally, due to the stacked and tapered design of coupler 120, mode matching can occur between the coupler 120 and the second semiconductor layer 104 of the photodetector 130 (which as mentioned above is the light absorption layer or intrinsic region 15 of a PIN PD 10 in some embodiments or the intrinsic region 25 of the avalanche PD 20 in other embodiments). Those skilled in the art will recognize that mode matching will only occur between the coupler 120 and the second semiconductor layer 104 (i.e., the light absorption layer) at location(s) along the lengths of these adjacent feature where they have the same propagation constant. The core materials of the stacked WG structure 30, 40 of coupler 120, the tapering of coupler 120, and, if present, the optional V-shape sidewall of the second semiconductor layer 104 (e.g., as indicated by dashed line 5b) will increase the likelihood that such mode matching will occur (i.e., that there will be location(s) along the lengths of the adjacent features that have the same propagation constant). Thus, matched mode light signals can pass, with low loss, from the waveguide 110 to the coupler 120 and from the coupler into the light absorption layer of photodetector 130 for processing.

FIGS. 2.1A and 2.1B are layout and cross-section diagrams, respectively, of a photonic structure 200.1. FIGS. 2.2A and 2.2B are layout and cross-section diagrams, respectively, of a photonic structure 200.2.

Referring to FIGS. 2.1A-2.2B, each photonic structure 200.1 and 200.2 can include a horizontally oriented polarization-independent photodetector (also simply "photodetector" hereafter) 230, which is on an insulator layer 202 and has a light absorption layer on a recessed section of a bottom semiconductor layer between two side sections, and adiabatic optical coupler(s) 220, 220', which is/are above side section(s) of the bottom semiconductor layer and, thus, positioned laterally adjacent to one or both sides of the light absorption layer. As discussed in greater detail below, the photonic structures 200.1-200.2 vary with respect to the configurations of the polarization-independent photodetector 130 (e.g., a PIN PD 10, as shown in the photonic structures 200.1 of FIGS. 2.1A-2.1B, or an avalanche PD 20, as shown in the photonic structures 200.2 of FIGS. 2.2A-2.2B).

More particularly, each photonic structure 200.1-200.2 can include a substrate 201. This substrate 201 can be a semiconductor substrate, such as a monocrystalline silicon (cSi) substrate or some other currently known or later developed semiconductor substrate. Each photonic structure 200.1-200.2 can further include an insulator layer 202 on the substrate 201. The insulator layer 202 can be, for example, a silicon dioxide (SiO$_2$) layer (also referred to herein as a buried oxide (BOX) layer) or a layer of some other currently known or later developed insulator material.

Each photonic structure 200.1-200.2 can further include a horizontally oriented polarization-independent photodetector 230 on the insulator layer 102.

Specifically, the photodetector 230 can include a first semiconductor layer 203 that is above and immediately adjacent to the top surface of the insulator layer 202. The first semiconductor layer 203 can be patterned so as to be essentially rectangular in shape with opposing first sidewalls 231 and 232 and opposing first end walls 233-234. Additionally, the first semiconductor layer 203 can include three immediately adjacent sections. As illustrated, the three sections can include a first side section, a second side section, and a center section positioned laterally between the first and second side sections. The center section can be a recessed section (i.e., it can have a recess therein). Alternatively, the top surface of the first semiconductor layer 203 can be essentially planar across the three sections. In any case, this first semiconductor layer 203 can be, for example, a monocrystalline semiconductor layer, such as a monocrystalline silicon (cSi) layer or a layer of some other currently known or later developed monocrystalline semiconductor material.

The photodetector 230 can further include a second semiconductor layer 204 on the center section of the first semiconductor layer 203 (e.g., on the recessed section). The second semiconductor layer 204 can have opposing second sidewalls oriented in essentially the same direction as the opposing first sidewalls 231-232 and opposing second end walls oriented in essentially the same direction as the opposing first end walls 233-234. As illustrated, the first semiconductor layer 203 can be wider than the second semiconductor layer 204 such that the side sections of the first semiconductor layer 203 extend laterally beyond the opposing second sidewalls of the second semiconductor layer 204. It should be noted that the opposing second sidewalls can be essentially planar as they extend between the opposing second end walls (e.g., see solid lines 5a) such that the width of the second semiconductor layer 204 is essentially uniform from end-to-end. However, alternatively, one or both second sidewalls can be V-shaped as they extend between the opposing second end walls (e.g., see dashed lines 5b) such that the width of the second semiconductor layer 204 tapers down from the end portions toward the center portion thereof. In any case, this second semiconductor layer 204 can specifically be an intrinsic semiconductor layer (i.e., an undoped semiconductor layer) and can function as the light absorption layer (LAL) of the photodetector 230. This second semiconductor layer 204 can be, for example, an epitaxially grown monocrystalline semiconductor layer of germanium (Ge), silicon (Si), silicon germanium (SiGe), or some other currently known or later developed light absorbing semiconductor material.

As mentioned above, the photodetector 230 in the photonic structure 200.1 of FIGS. 2.1A-2.1B can specifically be a PIN PD 10. The PIN PD 10 can include a P-doped region 12, an N-doped region 18, and an intrinsic region 15 (i.e., an undoped region, which is the light absorption region, also referred to as the photon absorption region) between the P-doped region 12 and N-doped region 18. In this case, the doped regions with the different conductivity types can be in the first and second side sections of the first semiconductor layer 203. That is, the first side section can be doped to have P-type conductivity at a relatively high conductivity level for the P-doped region 12 and can further include, within the P-doped region 12, a P-type contact region at an even higher conductivity level (e.g., a P+ contact region 11). The second side section can be doped to have N-type conductivity at a relatively high conductivity level for the N-doped region 18 and can further include, within the N-doped region 18, an N-type contact region at an even higher conductivity level (e.g., a N+ contact region 19). The center section of the first semiconductor layer 203 can be undoped (i.e., an intrinsic region 13). Since, as mentioned above, the second semiconductor layer 204 is an intrinsic semiconductor layer, the resulting structure includes intrinsic regions 15 and 13 positioned laterally between a P-doped region 12 with a P+ contact region 11 therein and an N-doped region 18 with an N+ contact region 19 therein.

Also, as mentioned above, the photodetector 230 in the photonic structure 200.2 of FIGS. 2.2A-2.2B can specifically be an avalanche PD 20. The avalanche PD 20 can, like the PIN PD 10, include a P-doped region 22, an N-doped region 28, and an intrinsic region 25 between the P-doped region 22 and N-doped region 28. However, the avalanche PD 20 can further include, inserted between the N-doped region 28 and the intrinsic region 25, an additional intrinsic region 27 (referred to as a multiplication region) and an additional P-doped region 26 (referred to as a charge region). Thus, for example, the first side section can be doped to have P-type conductivity at a relatively high conductivity level for the P-doped region 22 and can further include, within the P-doped region 22, a P-type contact region at an even higher conductivity level (e.g., a P+ contact region 21). The center section can include an intrinsic region 23 below the recess. The second side section can be doped to have an N-type region (i.e., an N-dope region 28) adjacent to the first sidewall 232 and, within the N-doped region 28, an N-type contact region (i.e., an N+ contact region 29). The second side section can further be doped to have an additional P-type region (i.e., additional P-doped region 26) that is positioned laterally adjacent to intrinsic regions 23 and 25 and separated from the N-doped region 28 by an additional intrinsic region 27. As mentioned above, those skilled in the art will recognize that such avalanche PDs provide internal multiplication gain and higher sensitivity over other types of photodetectors (e.g., PIN PDs).

Each photonic structure 200.1-200.2 can further include at least one adiabatic optical coupler on at least one side section of photodetector 230 and, thus, positioned laterally adjacent and oriented along a second sidewall of the second semiconductor layer 204. For purposes of illustration, two optical couplers (i.e., a coupler 220 and an additional coupler 220') are shown in the figures. However, it should be understood that the figures are not intended to be limiting and that the photonic structure 200.1-200.2 could, alternatively, include only one such optical coupler. In any case, in the photonic structures 200.1 and 200.1, each optical coupler 220, 220' can include at least a first core 51, 51'. The first core 51, 51' can be made of some suitable relatively high refractive index material. Such high refractive index materials can include, but are not limited to, silicon nitride (SiN), silicon carbon nitride (SiCN), silicon oxynitride (SiON), aluminum nitride (AlN), gallium nitride (GaN), alumina (Al2O3) or some other suitable high refractive index material. Optionally, the coupler 220, 220' can be a stacked WG structure and can include one or more additional cores 52, 52' stacked above the first core 51, 51'. In a photonic structure 200.1-200.2 with two optical couplers 220 and 220', the couplers can be symmetric and essentially identical. Alternatively, the couplers could be asymmetric and can include different numbers of cores and/or different core materials.

It should be noted that the coupler(s) 220, 220' extends from one end of photodetector 130 toward, to, or even past the opposite end along one side. Additionally, the coupler 220, 220' is tapered from one end toward or to the opposite end. As illustrated in FIGS. 4A-4D, the taper can be linear or non-linear and, optionally, one or both ends of the coupler can be curved (e.g., away from the photodetector). In the case of a coupler that is a stacked WG coupler, each core can be tapered, as illustrated. Each core can have the same area dimensions or different area dimensions (e.g., different cores can have different maximum and/or minimum width and/or different maximum and/or minimum lengths. Alternatively, at least one core can be tapered and at least one core can be non-tapered.

Each photonic structure 200.1-200.2 can further include waveguide(s) 210, 210' coupled to the wide ends of coupler(s) 220, 220'. For example, a waveguide 210 can be coupled to the wide end of coupler 220 and, thereby to the photodetector 230 so that light signals from the waveguide 210 can be received and processed by the photodetector 230 and/or a waveguide 210' can be coupled to the wide end of coupler 220' and, thereby to the photodetector 230 so that light signals (of the same or different mode) can be received and processed by the photodetector 230. The cores of the waveguide and coupler can be continuous portions of the same core material. For example, see the cores 212 and 51 of the waveguide 210 and coupler 220 that are continuous portions of the same core material (e.g., SiN). Alternatively, the cores of the waveguide and coupler can be made of different core materials. For example, see the cores 211 and 51 of the waveguide 210' and coupler 220' that are made of different core materials (e.g., cSi and SiN, respectively). In this case, an end of coupler 220 can overlay an end of the waveguide 210' and can be tapered to facilitate mode matching between the waveguide 210 and the coupler 220'.

It should be noted that in photonic structures 200.1-200.2 that have two optical couplers the couplers 220, 220' can TM-mode couplers, TE-mode couplers, or one can be a TM-mode coupler and the other a TE-mode coupler. Furthermore, as illustrated in FIGS. 2.1A and 2.2A, the waveguides 210, 210' are at the same end of the photodetector 230 and the couplers 220, 220' taper in the same direction. However, alternatively, the waveguides 210, 210' could be at opposite ends of the photodetector 230 and the couplers 220, 220' could taper in opposite directions (e.g., see FIGS. 5A-5B).

In the photonic structures 200.1-200.2, mode matching (e.g., TM-mode matching or TE-mode matching) can occur between waveguide(s) 210, 210' and corresponding coupler(s) 220, 220' and, due to the tapered design of coupler(s) 220, 220', mode matching can also occur between the coupler(s) 220, 220' and the second semiconductor layer 204 of the photodetector 230 (which as mentioned above is the light absorption layer or intrinsic region 15 of the PIN PD 10 or the intrinsic region 25 of the avalanche PD 20). Those skilled in the art will recognize that mode matching will only occur between the coupler(s) 220, 220' and the second semiconductor layer 204 at location(s) along the lengths of these adjacent features where they have the same propagation constant. The core material(s) of coupler(s) 220, 220', the tapering of coupler(s) 220, 220' and, if present, the optional V-shape sidewall(s) of second semiconductor layer 204 (e.g., as indicated by dashed lines 5b) will increase the likelihood that such mode matching will occur (i.e., that there will be location(s) along the lengths of the adjacent features that have the same propagation constant). Thus, matched mode light signals can pass, with low loss, from the waveguide 210, 210' to the coupler 220, 220' and from the coupler 220, 220' into the light absorption layer 204 of photodetector 230 for processing.

FIGS. 3.1A and 3.1B are layout and cross-section diagrams, respectively, of a photonic structure 300.1. FIGS. 3.2A and 3.2B are layout and cross-section diagrams, respectively, of a photonic structure 300.2.

As shown in FIGS. 3.1A-3.2B, still other photonic structure embodiments 300.1-300.2 can include a combination of some of the features of the previously described embodiments. For example, photonic structures 300.1-300.2 can include a vertically oriented polarization-independent photodetector 330, which is on an insulator layer and includes a bottom semiconductor layer with a recessed section and an additional section positioned laterally thereto, a light absorption layer on the recessed section, and a top semiconductor layer on the light absorption layer. This photonic structure can also include an adiabatic optical coupler, which is on the insulator layer positioned laterally adjacent to one side of the photodetector and includes stacked cores, and another adiabatic optical coupler, which is on the additional section of the bottom semiconductor layer.

More particularly, each photonic structure 300.1-300.2 can include a substrate 301. This substrate 301 can be a semiconductor substrate, such as a monocrystalline silicon (cSi) substrate or some other suitable semiconductor substrate. Each photonic structure 300.1-300.2 can further include an insulator layer 302 on the substrate 301. The insulator layer 302 can be, for example, a silicon dioxide ($SiO_2$) layer (also referred to herein as a buried oxide (BOX) layer) or a layer of some other suitable insulator material.

Each photonic structure 300.1-300.2 can further include a vertically oriented polarization-independent photodetector (also simply "photodetector" hereafter) 330 on the insulator layer 302. This photodetector 330 can be configured essentially the same as the photodetector 130, as discussed in detail above regarding the photonic structures 100.1-100.4 of FIGS. 1.1A-1.4B.

For example, the photodetector 330 can include a first semiconductor layer 303 that is above and immediately adjacent to the top surface of the insulator layer 302. The first semiconductor layer 303 can be essentially rectangular in shape with opposing first sidewalls and opposing first end walls. The first semiconductor layer 303 can include two immediately adjacent sections. As illustrated, the two sections can include a recessed section on one side and an additional section positioned laterally adjacent to the recessed section. Alternatively, the top surface of the first semiconductor layer 303 can be essentially planar across the two sections. In any case, this first semiconductor layer 303 can be, for example, a monocrystalline semiconductor layer, such as a monocrystalline silicon (cSi) layer or a layer of some other suitable monocrystalline semiconductor material. The photodetector 330 can further include a second semiconductor layer 304 on one section of the first semiconductor layer 303 (e.g., on the recessed section). Opposing second sidewalls of the second semiconductor layer 304 can be essentially planar as they extend between the opposing second end walls (e.g., see solid lines 5a) or the second sidewall(s) can be V-shaped between the opposing second end walls (e.g., see dashed lines 5b). In any case, this second semiconductor layer 304 can specifically be an intrinsic semiconductor layer (i.e., an undoped semiconductor layer) and can function as the light absorption layer (LAL) of the photodetector 330. This second semiconductor layer 304 can be, for example, an epitaxially grown monocrystalline semiconductor layer of germanium (Ge), silicon (Si), silicon germanium (SiGe), or some other suitable light absorbing semiconductor material. The photodetector 330 can further include a third semiconductor layer 305 on the top surface of the second semiconductor layer 304. The sidewalls and end walls of the third semiconductor layer 305 can be vertically aligned with the sidewalls and the end walls of the second semiconductor layer 304. This third semiconductor layer 305 can be, for example, an epitaxially grown monocrystalline semiconductor layer of the same semiconductor material used for the first semiconductor layer 303 (e.g., cSi) or of some other suitable monocrystalline semiconductor material. The photodetector 330 can be a PIN PD 10 (described in detail above regarding the photonic structure 100.1 of FIGS. 1.1A-1.1B and the photonic structure 100.3 of FIGS. 1.3A-1.3B), as shown in the photonic structure 300.1 of FIGS. 3.1A-3.1B. Alternatively, the photodetector 330 can be an avalanche PD 20 (described in detail above regarding the photonic structure 100.2 of FIGS. 1.2A-1.2B and the photonic structure 100.4 of FIGS. 1.4A-1.4B), as shown in the photonic structure 300.2 of FIGS. 3.2A-3.2B.

Each photonic structure 300.1-300.2 can further include two couplers (i.e., a coupler 320a and an additional coupler 320b).

Specifically, each photonic structure 300.1-300.2 can include an adiabatic optical coupler 320a on the insulator layer 302 and positioned laterally adjacent to one side of photodetector 330. In each of these embodiments, the optical coupler 320a can specifically be a stacked WG structure. For example, as illustrated, the optical coupler 320a can be a stacked WG structure 40 (described in detail above regarding the photonic structure 100.3 of FIGS. 1.3A-1.3B and the photonic structure 100.4 of FIGS. 1.4A-1.4B). Alternatively, the optical coupler 320a could be a stacked WG structure 30 (described in detail above regarding the photonic structure 100.1 of FIGS. 1.1A-1.1B and the photonic structure 100.2 of FIGS. 1.2A-1.2B).

Each photonic structure 300.1-300.2 can further include an additional adiabatic optical coupler 320b on the additional section of the first semiconductor layer 303 so as to be positioned laterally adjacent to the second semiconductor layer 304 so that the second semiconductor layer is positioned laterally between the two couplers 320a and 320b. The optical coupler 320b can be configured essentially the same as the optical coupler 220 or 220' of the photonic structures 200.1-200.2 of FIGS. 2.1A-2.2B, discussed in detail above.

Each photonic structure 300.1-300.2 can further include waveguides 310a, 310b coupled to the wide ends of the couplers 320a, 320b and, thereby to the photodetector 330. The waveguide 310a can be configured essentially the same as the waveguide 110 of the photonic structures 100.1-100.4 of FIGS. 1.1A-1.4B, discussed in detail above (e.g., with a cSi core 311). The waveguide 310b can be configured the same as any of the waveguides 210 or 210' of the photonic structures 200.1-200.2 of FIGS. 2.1A-2.2B, discussed in detail above (e.g., with a SiN core 312).

Referring again to FIGS. 1.1A-3.2B, each of the photonic structures 100.1-100.4, 200.1-200.2, and 300.1-300.2 described above can further include interlayer dielectric (ILD) material 150, 250, 350 cover the photodetector 130, 230, 330, optical coupler(s) 120, 220-220', 320a-320b, and waveguide(s) 110, 210-210', 310a-310b. The ILD material 150, 250, 350 can include one or more layers of ILD material. The ILD material can specifically be selected so that any portions of the ILD material immediately adjacent to the light absorbing layer of the photodetector 130, 230, 330 and the core(s) of the optical coupler(s) 120, 220-220', 320a-320b and the waveguide(s) 110, 210-210', 310a-310b. For example, in some embodiments, the ILD material 150, 250, 350 can be $SiO_2$, which has a relatively small refractive index of less than 1.6.

It should be noted that the above-described photonic structures can be manufactured by performing a combination of various processes including, but not limited to, material deposition and epitaxial growth processes, lithographic patterning and etch processes, dopant implantation processes, etc. The order in which these processes will be performed, and the specifications will vary depending upon the specific photonic structure being formed. However, it should be understood that techniques for performing such processes are known in the art and, thus, the details thereof have been omitted from this specification in order to allow the reader to focus on the salient aspects of the disclosed embodiments.

In any case, it should be understood that in the structures and method described above, a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Additionally, as discussed in detail above, the disclosed photonic structures include waveguide(s) as well as optical coupler(s), which are waveguide structures or stacked waveguide structures. To facilitate and control optical signal propagation, such waveguide structures include at least one core and cladding, which covers the surfaces of the core(s), and which is made of a material that has a smaller refractive index than the material used for the core. The function of the cladding material is to confine the optical signals within the waveguide core by reflecting the signals at interfaces between the two materials. Confinement can be strengthened by increasing the refractive index contrast between the core and cladding materials. Various core and cladding materials are discussed above with regard to each of the embodiments. It should be understood that the discussion of such core and cladding materials is not intended to be limiting. The following is a sample list of materials (including the refractive indices (n) thereof) from which core and/or cladding could be selected for such waveguide structures as long as the desired refractive index differential is achieved (i.e., as long as the cladding material has a smaller refractive index than the core material it clads): SiGe (Silicon germanium), $n=\sim 5.4$; Polysilicon, $n=\sim 3.9$; cSi (Monocrystalline silicon) $n=\sim 3.9$; HfO2 (Hafnium dioxide), $n=2.0754$ @1.31 µm, $n=2.0709$ @1.55 µm; ZrO2 (Zirconium dioxide, Zirconia), $n=2.1155$ @1.31 µm, $n=2.1103$ @1.55 µm; Si3N4 (Silicon nitride), $n=\sim 2$; SiON (Silicon oxynitride), $n=\sim 1.46$ to $\sim 2.1$; AN (Aluminum nitride), $n=\sim 2.1$ to $\sim 2.4$; TiO2 (Titanium dioxide), $n=2.4622$ @1.31 µm, $n=2.4538$ @1.55 µm; ZnO (Zinc monoxide), $n=1.9318$ @1.31 µm, $n=1.9267$ @1.55 µm; Al2O3 (Aluminum oxide), $n=1.7503$ @1.31 µm, $n=1.7462$ @1.55 µm; MgO (Magnesium oxide), $n=1.7178$ @1.31 µm, $n=1.7146$ @1.55 µm; SiO2 (Silicon dioxide), $n<1.6$, $n=1.45$ @1.31 µm; CaF2 (Calcium fluoride), $n=1.4272$ @1.31 µm, $n=1.4260$ @1.55 µm; OMCTS (SiCOH) $n=1.406$ @1.31 µm; and MgF2 (Magnesium fluoride), $n=1.3718$ @1.31 µm, $n=1.3705$ @1.55 µm.

It should be understood that the terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a photodetector including:
   a first semiconductor layer; and
   a second semiconductor layer on the first semiconductor layer; and
   a coupler including stacked cores including: a first core positioned laterally adjacent to the first semiconductor layer; and a second core positioned laterally adjacent to the second semiconductor layer.

2. The structure of claim 1, further comprising an insulator layer; and a waveguide,
   wherein the first semiconductor layer, the first core of the stacked cores of the coupler, and a core of the waveguide are above and immediately adjacent to the insulator layer and comprise a same monocrystalline semiconductor material, and
   wherein the first core of the stacked cores of the coupler and the core of the waveguide are continuous portions of the monocrystalline semiconductor material.

3. The structure of claim 2, wherein the monocrystalline semiconductor material comprises monocrystalline silicon.

4. The structure of claim 2, wherein the second core of the stacked cores of the coupler and the second semiconductor layer comprise different materials.

5. The structure of claim 1, wherein the second core comprises one of a polycrystalline silicon core and a silicon nitride core and wherein the second semiconductor layer comprises one of a monocrystalline silicon layer, a monocrystalline germanium layer, and a monocrystalline silicon germanium layer.

6. The structure of claim 1, wherein the coupler is a tapered coupler with the first core and the second core being tapered and with the second core being narrower in width than the first core across a length of the coupler.

7. The structure of claim 1, wherein the stacked cores further include a third core.

8. The structure of claim 1, wherein the second semiconductor layer has a sidewall that is V-shaped.

9. The structure of claim 1,
   wherein the photodetector is a PIN photodiode,
   wherein the first semiconductor layer has a first type conductivity and is wider than the second semiconductor layer,
   wherein the first semiconductor layer has a recessed section proximal to the coupler and an additional section distal from the coupler,
   wherein the second semiconductor layer is an intrinsic semiconductor layer above and immediately adjacent to the recessed section of the first semiconductor layer and the additional section of the first semiconductor layer extends laterally beyond the second semiconductor layer,
   wherein the additional section of the first semiconductor layer includes a first contact region, and
   wherein the photodetector further comprises a third semiconductor layer that is above and immediately adjacent to the second semiconductor layer, that has a second type conductivity different from the first type conductivity, and that includes a second contact region.

10. The structure of claim 1,
    wherein the photodetector is an avalanche photodiode,
    wherein the first semiconductor layer is wider than the second semiconductor layer,
    wherein the first semiconductor layer has a recessed section proximal to the coupler and an additional section distal from the coupler,
    wherein the second semiconductor layer is an intrinsic semiconductor layer above the recessed section of the first semiconductor layer,
    wherein the additional section of the first semiconductor layer includes an N-type region and, in the N-type region, an N-type contact region,
    wherein the recessed section of the first semiconductor layer includes an intrinsic region positioned laterally adjacent to the N-type region,
    wherein the photodetector further includes an additional semiconductor layer with P-type conductivity stacked vertically between the recessed section of the first semiconductor layer and the second semiconductor layer, and
    wherein the photodetector further comprises a third semiconductor layer that is above and immediately adjacent to the second semiconductor layer, that has the P-type conductivity, and that includes a P-type contact region.

11. A structure comprising:
    a photodetector including:
    a first semiconductor layer having two side sections and a center section positioned laterally between the two side sections; and
    a second semiconductor layer on the center section; and
    a coupler on a side section of the two side sections of the first semiconductor layer and positioned laterally adjacent to the second semiconductor layer.

12. The structure of claim 11, further comprising a waveguide adjacent to the coupler, wherein cores of the waveguide and the coupler comprise continuous portions of a core material.

13. The structure of claim 12, wherein the core material comprises silicon nitride.

14. The structure of claim 11, wherein the second semiconductor layer comprises one of a monocrystalline silicon layer, a monocrystalline germanium layer, and a monocrystalline silicon germanium layer.

15. The structure of claim 11, wherein the coupler is tapered.

16. The structure of claim 11, further comprising an additional coupler,
    wherein the coupler and the additional coupler are on the side sections with the second semiconductor layer positioned laterally between the coupler and the additional coupler, and
    wherein the coupler and the additional coupler are tapered with tapering being in any of a same direction and opposite directions.

17. The structure of claim 11, wherein the second semiconductor layer has opposing sidewalls that are one of planar and V-shaped.

18. The structure of claim 12,
    wherein the photodetector is a PIN photodiode,
    wherein the side sections include:
    a first side section including a P-type region and, within the P-type region, a P-type contact region; and
    a second side section including an N-type region and, within the N-type region, an N-type contact region,
    wherein the center section is a recessed section and includes an intrinsic region positioned laterally between the P-type region and the N-type region, and
    wherein the second semiconductor layer is an intrinsic semiconductor layer above and immediately adjacent to the recessed section of the first semiconductor layer.

19. The structure of claim 12,
wherein the photodetector is an avalanche photodiode,
wherein the center section is a recessed section,
wherein the side sections include:
- a first side section including a P-type region and, within the P-type region, a P-type contact region; and
- a second side section including an N-type region, an N-type contact region within the N-type region, an additional P-type region adjacent to the recessed section, and an intrinsic region positioned laterally between the N-type region and the additional P-type region, wherein the recessed section includes an additional intrinsic region positioned laterally between the P-type region in the first side section and the additional P-type region in the second side section, and
wherein the second semiconductor layer is an intrinsic semiconductor layer above and immediately adjacent to the recessed section of the first semiconductor layer.

20. A structure comprising:
a photodetector including:
- a first semiconductor layer having a recessed section and an additional section positioned laterally adjacent to the recessed section;
- a second semiconductor layer on the recessed section of the first semiconductor layer, wherein the second semiconductor layer is an intrinsic semiconductor layer; and
- a third semiconductor layer on the second semiconductor layer;

a coupler including stacked cores, wherein the stacked cores include a first core positioned laterally adjacent to the first semiconductor layer; and a second core positioned laterally adjacent to the second semiconductor layer; and
an additional coupler including an additional core on the additional section of the first semiconductor layer.

* * * * *